(12) United States Patent
Nihei et al.

(10) Patent No.: US 7,867,814 B2
(45) Date of Patent: Jan. 11, 2011

(54) RESISTANCE MEMORY ELEMENT AND METHOD OF MANUFACTURING THE SAME

(75) Inventors: Mizuhisa Nihei, Kawasaki (JP); Hiroyasu Kawano, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 61 days.

(21) Appl. No.: 12/174,868

(22) Filed: Jul. 17, 2008

(65) Prior Publication Data

US 2008/0296551 A1     Dec. 4, 2008

Related U.S. Application Data

(63) Continuation of application No. PCT/JP2006/300588, filed on Jan. 18, 2006.

(51) Int. Cl.
*H01L 21/06* (2006.01)

(52) U.S. Cl. .......... 438/102; 438/800; 977/932

(58) Field of Classification Search ........... 438/800, 438/102, 103; 977/932
See application file for complete search history.

(56) References Cited

U.S. PATENT DOCUMENTS

| | | | |
|---|---|---|---|
| 6,054,226 A | | 4/2000 | Takeda et al. |
| 7,507,674 B2* | | 3/2009 | Park et al. .......... 438/724 |
| 2004/0201378 A1 | | 10/2004 | Sugano |
| 2004/0219773 A1* | | 11/2004 | Choi et al. ........... 438/597 |
| 2004/0264064 A1 | | 12/2004 | Sakakima |
| 2005/0215049 A1* | | 9/2005 | Horibe et al. ........ 438/622 |

FOREIGN PATENT DOCUMENTS

| EP | 1533846 A1 | 5/2003 |
|---|---|---|
| JP | 10-190092 A | 7/1998 |
| JP | 2003-008105 A | 1/2003 |
| JP | 2003-347515 A | 12/2003 |
| JP | 2004-301548 A | 10/2004 |
| JP | 2005-039228 A | 2/2005 |
| JP | 2005-123298 A | 5/2005 |
| JP | 2005-244145 A | 9/2005 |

OTHER PUBLICATIONS

International Search Report of PCT/JP2006/300588; date of mailing Mar. 7, 2006.
Liu, S.Q. et al.; "Electric-Pulse-induced reversible resistance change effect in magnetoresistive films"; Applied Physics Letters, vol. 76, No. 19, pp. 2749-2751, May 2000.

* cited by examiner

*Primary Examiner*—Zandra Smith
*Assistant Examiner*—Christy L Novacek
(74) *Attorney, Agent, or Firm*—Fujitsu Patent Center

(57) ABSTRACT

A resistance memory element having a pair of electrodes and an insulating film sandwiched between a pair of electrodes includes a plurality of cylindrical electrodes of a cylindrical structure of carbon formed in a region of at least one of the pair of electrodes, which is in contact with the insulating film. Thus, the position of the filament-shaped current path which contributes to the resistance states of the resistance memory element can be controlled by the positions and the density of the cylindrical electrodes.

10 Claims, 11 Drawing Sheets

RESISTANCE MEMORY ELEMENT AND METHOD OF MANUFACTURING THE SAME

CROSS REFERENCE TO RELATED APPLICATIONS

This application is a Continuation of International Application No. PCT/JP2006/300588, with an international filing date of Jan. 18, 2006, which designating the United States of America, the entire contents of which are incorporated herein by reference.

TECHNICAL FIELD

The present invention relates to a resistance memory element, more specifically, a resistance memory element memorizing a plurality of resistance states of different resistance values, and a method of manufacturing the same.

BACKGROUND

Recently, as a new memory device, a semiconductor memory device called Resistive Random Access Memory (RRAM) is noted. The RRAM uses a resistance memory element which has a plurality of resistance states of different resistance values, which are changed by electric stimulations applied from the outside and whose high resistance state and low resistance state are corresponded to, e.g., information "0" and "1" to be used as a memory element. The RRAM highly potentially has high speed, large capacities, low electric power consumption, etc. and is considered prospective.

The resistance memory element has a resistance memory material whose resistance states are changed by the application of voltages sandwiched between a pair of electrodes. As the typical resistance memory material, oxide materials containing transition metals are known.

The related arts are disclosed in, e.g., Japanese published unexamined patent application No. 2003-008105, Japanese published unexamined patent application No. 2004-301548, Japanese published unexamined patent application No. 2005-039228, and S. Q. Liu ("Electrical-pulse-induced reversible resistance change effect in magnetoresistive film", Appl. Phys. Lett., vol. 76, p. 2749, 2000).

RRAM uses the resistance memory element whose high resistance state and low resistance state are reversibly changed by application of voltages, but its operational mechanism has not be cleared. The inventors of the present application have an idea as one operational mechanism of the resistance memory element that the filament-shaped property changed (current path) formed in the resistance memory material would contribute.

This filament-shaped current path would be formed in a part where an electric field is locally concentrated, and the structure of the conventional resistance memory element, which is similar to the parallel plate capacitor, has found difficult to control the position and the density of the filament-shaped current path. This would be a barrier to further improving the density.

SUMMARY

According to one aspect of an embodiment, there is provided a resistance memory element comprising: a pair of electrodes, and an insulating film sandwiched between the pair of electrodes, wherein at least one of the pair of electrodes has a plurality of cylindrical electrodes of a cylindrical structure of carbon in a region thereof, which is in contact with the insulating film.

According to another aspect of an embodiment, there is provided a semiconductor memory device comprising: a memory cell transistor; and a resistance memory element including: a pair of electrodes one of which is connected to the memory cell transistor; an insulating film sandwiched between the pair of electrodes, wherein at least one of the pair of electrodes has a plurality of cylindrical electrodes of a cylindrical structure of carbon in a region thereof, which is in contact with the insulating film.

According to further another aspect of an embodiment, there is provided a method of manufacturing a resistance memory element comprising the steps of: forming a lower electrode over a substrate; forming an insulating film on the lower electrode; forming a plurality of cylindrical electrodes of a cylindrical structure of carbon on the insulating film; and forming an upper electrode electrically connected to the plurality of cylindrical electrodes on the plurality of cylindrical electrodes.

According to further another aspect of an embodiment, there is provided a method of manufacturing a resistance memory element comprising the steps of: forming a lower electrode over a substrate; forming a plurality of cylindrical electrodes of a cylindrical structure of carbon electrically connected to the lower electrode on the lower electrode; forming an insulating film on the plurality of cylindrical electrodes; and forming an upper electrode on the insulating film.

DETAILED DESCRIPTION OF THE EMBODIMENTS

A First Embodiment

The resistance memory element and the method of manufacturing the same according to a first embodiment of the present invention will be explained with reference to FIGS. 1 to 3F.

Figure 1:
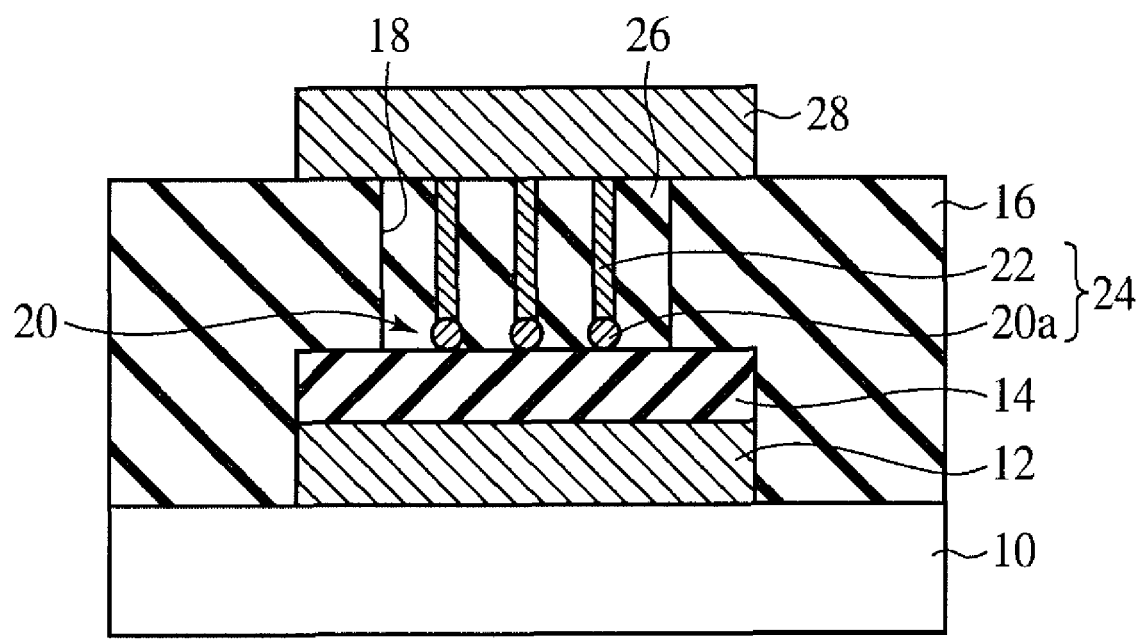
FIG. 1 is a diagrammatic sectional view showing the structure of the resistance memory element according to a first embodiment of the present invention.
Figure 2:
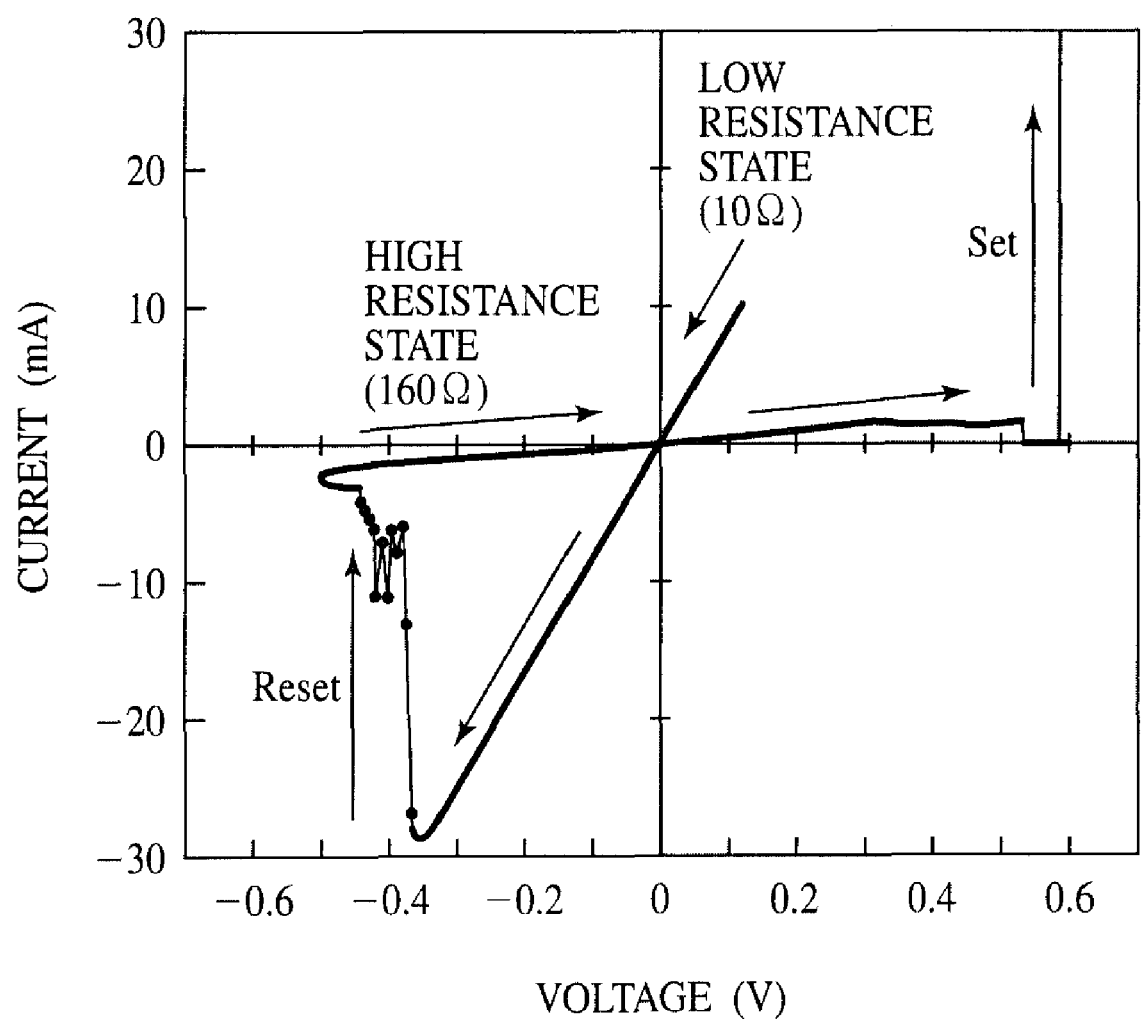
FIG. 2 is a graph showing the current-voltage characteristics of the resistance memory element according to the first embodiment of the present invention.

FIG. 1 is a diagrammatic sectional view showing the structure of the resistance memory element according to the present embodiment. FIG. 2 is a graph showing the current-voltage characteristics of the resistance memory element according to the present embodiment. FIGS. 3A-3F are sectional views showing the method of manufacturing the resistance memory element according to the present embodiment.

First, the structure of the resistance memory element according to the present embodiment will be explained with reference to FIG. 1.

Over a substrate 10, a lower electrode 12 is formed. On the lower electrode 12, a resistance memory layer 14 of a resistance memory material is formed. On the substrate 10 with the lower electrode 12 and the resistance memory layer 14 formed on, an insulating film 16 with an opening 18 formed down to the resistance memory layer 14 is formed. On the resistance memory layer 14 in the opening 18, a catalyst metal layer 20 containing a plurality of catalytic metal isles 20a is formed. On the catalytic metal isles 20a, carbon nanotubes 22 are formed. Thus, a plurality of cylindrical electrodes 24 of the catalytic metal isles 20a and the carbon nanotubes 22 are formed. In the opening 18 with the cylindrical electrodes 24 formed in, an insulating film 26 is buried with the upper parts of the cylindrical electrodes 24 exposed. Over the insulating films 16, 26, an upper electrode 18 electrically connected to the cylindrical electrodes 24 is formed.

As described above, in the resistance memory element according to the present embodiment, the cylindrical electrodes 24 of the catalytic metal isles 20a and the carbon nanotubes 22 are formed between the resistance memory layer 14 and the upper electrode 18. The cylindrical electrodes 14 are thus formed, whereby the position and the density of the filament-shaped current path to be formed in the resistance memory layer 14 is defined by the positions and the density of the cylindrical electrodes 14. The positions and the density of the cylindrical electrode 24 are suitably controlled, whereby the position and the density of the filament-shaped current path can be controlled. The write current flows, concentrated in the location where the cylindrical electrode 24 are formed, which allows the writing to be made with lower operation voltages.

The positions and the density of the cylindrical electrodes 24 can be controlled by the density of the catalytic metal layer 20 for forming the carbon nanotubes 22 and the formation probability (activation ratio) of the carbon nanotubes 22 on the catalytic metal layer 20. The density of the catalytic metal layer 20 and the activation ratio of the carbon nanotubes 22 on the catalytic metal layer 20 can be controlled by conditions for forming the catalytic metal layer 20 and the carbon nanotubes 22.

FIG. 2 is a graph showing the current-voltage characteristics of the resistance memory element according to the present embodiment. As shown in FIG. 2, the resistance memory element according to the present embodiment has the RRAM characteristic that the high resistance state and the low resistance state are switched by the application of voltages. That is, an about −0.4 V write voltage is applied to the resistance memory element in the low resistance state of about 10Ω, whereby the resistance memory element can be transited (reset) to the high resistance state of an about 160Ω. An about 0.6 V write voltage is applied to the resistance memory element in the high resistance state of about 160Ω, whereby the resistance memory element can be transited (set) to the low resistance state of about 10Ω.

Next, the method of manufacturing the resistance memory element according to the present embodiment will be explained with reference to FIGS. 3A to 3F.

Figure 3A:
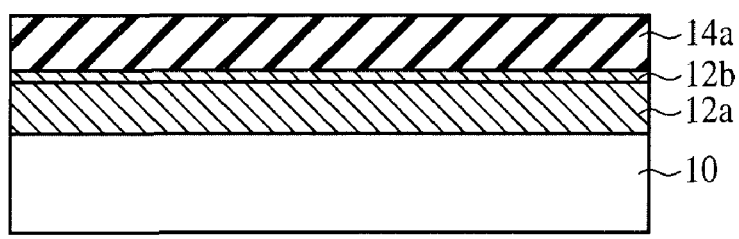
FIGS. 3A-3F are sectional views showing the method of manufacturing the resistance memory element according to the first embodiment of the present invention.

First, on the substrate 10, a 100 nm-thickness copper (Cu) film 12a, for example, a 5 nm-thickness tantalum (Ta) film 12b, for example, and a 30 nm-thickness titanium oxide (TiO$_2$) film 14a, for example, are deposited by, e.g., sputtering method or evaporation method (FIG. 3A). In the specification of the present application, the substrate includes a semiconductor substrate itself, such as a silicon substrate or others, and also the semiconductor substrate with elements, MOS transistors, etc., interconnections, etc. formed on.

Then, by photolithography and ion milling, the TiO$_2$ film 14a, the Ta film 12b and the Cu film 12a are patterned to form the lower electrode 12 of the Cu film 12a and the Ta film 12b, and the resistance memory layer 14 of the TiO$_2$ film 14a.

Figure 3B:
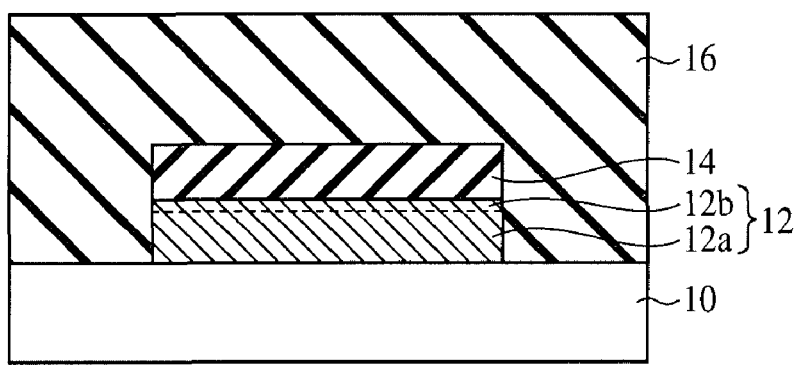

The, over the substrate 10 with the lower electrode 12 and the resistance memory layer 14 formed on, a 350 nm-thickness silicon oxide (SiO$_2$) film, for example, is deposited by, e.g., CVD method. Thus, the insulating film 16 of the SiO$_2$ film is formed (FIG. 3B).

Then, by photolithography and dry etching, the opening 18 down to the resistance memory layer 14 is formed in the insulating film 16. The insulating film 16 may be dry etched with, e.g., a fluorine-based etching gas. From the viewpoint of decreasing the etching damage to the resistance memory layer 14, both the dry etching and the wet etching with, e.g., a hydrofluoric acid-based aqueous solution may be used.

Figure 3C:
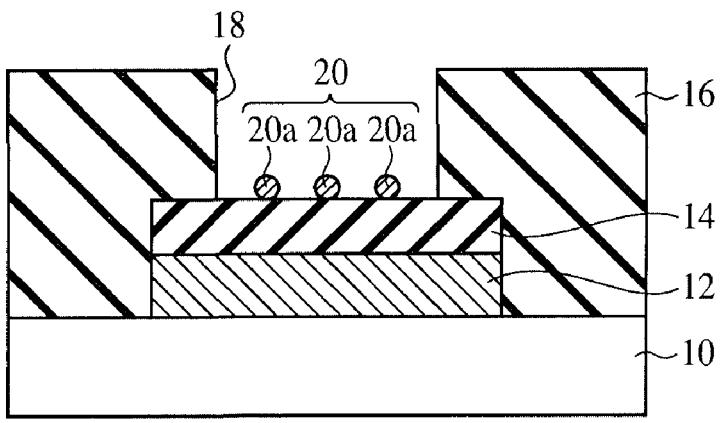

Then, on the resistance memory layer 14 in the opening 18, the catalytic metal layer 20 of a plurality of catalytic metal isles 20a formed isolated from each other is formed (FIG. 3C). The catalytic metal layer 20 may be formed by depositing Cobalt (Co) corresponding to, e.g., a 1 nm-thickness by, e.g., sputtering method or evaporation method. After the Co deposition, annealing of a temperature as high as, e.g., about 400° C. is made to aggregate the deposited Co, and the catalytic metal isles 20a of particulate Co are formed isolated from each other. The catalytic metal layer 20 can be formed selectively in the opening 18 by lift-off method using the photoresist film used in forming the opening 18 in the insulating film 16. The density of the catalytic metal layer 20 can be controlled by conditions (temperature and processing period of time) of the annealing.

The metal material forming the catalytic metal layer 20 can be, other than Co, iron (Fe), nickel (Ni) or an alloy containing these metals. The catalytic metal layer 20 may be formed by blowing particles of a catalytic metal other than by using the aggregation of the thin film. For example, the catalytic metal layer 20 may be formed as a particulate catalyst by laser ablation method or others with the density being controlled. At this time, the density can be controlled by the deposition period of time.

Then, on the catalytic metal layer 20, the carbon nanotubes 22 are grown. The carbon nanotubes 22 are grown by thermal CVD method, e.g., under the conditions of the reaction gas of a mixed gas of acetylene and hydrogen, the acetylene flow rate of 80 sccm, the hydrogen flow rate of 20 sccm, the film forming chamber pressure of 200 Pa and the substrate temperature of 900° C.

Otherwise, the carbon nanotubes 22 are grown by thermal filament CVD method, wherein the gas dissociation is made by a thermal filament, e.g., under the conditions of the reaction gas of a mixed gas of acetylene and hydrogen, the acetylene flow rate of 80 sccm, the hydrogen flow rate of 20 sccm, the film forming chamber pressure of 1000 Pa, the substrate temperature of 600° C. and the thermal filament temperature of 1800° C.

Otherwise, the carbon nanotubes 22 may be grown by DC plasma thermal filament CVD method, in which a DC plasma and a thermal filament are combined, e.g., under the conditions of the reaction gas of a mixed gas of acetylene and hydrogen, the acetylene flow rate of 80 sccm, the hydrogen flow rate of 20 sccm, the film forming chamber pressure of 1000 Pa, the substrate temperature of 600° C. and the thermal filament temperature of 1800° C.

To vertically orient the carbon nanotubes 22, 1400 V DC current is applied to the substrate 10 with the film forming chamber being the ground potential. The DC current is applied between the chamber and the substrate 10, whereby the carbon nanotubes oriented vertically (along the normal direction of the substrate) can be formed.

The carbon nanotubes are not essentially grown as described above but may be grown by, e.g., RF plasma CVD method.

The activation ratio of the carbon nanotubes 22 can be controlled by the ratio of acetylene and hydrogen or the growth temperature.

Thus, in the opening 18, a plurality of cylindrical electrodes 24 of the catalytic metal isles 20a and the carbon nanotubes 22 are formed.

Figure 3D:
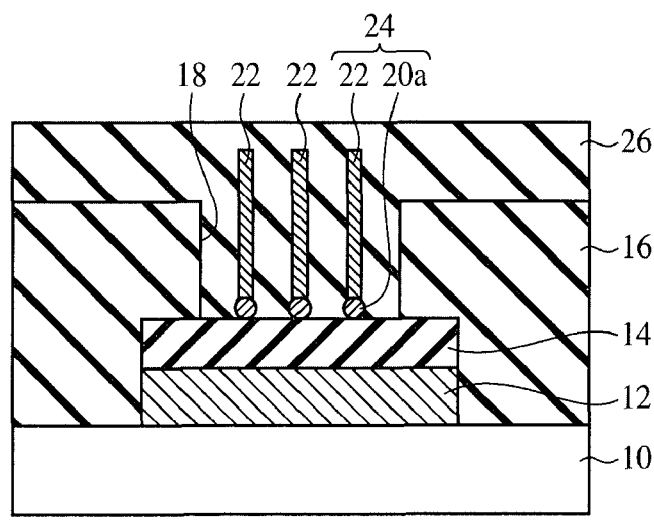

Next, over the entire surface, a 500 nm-thickness $SiO_2$ film, for example, is deposited by, e.g., CVD method. Thus, the insulating film 26 of the $SiO_2$ film is formed (FIG. 3D). Thus, the opening 18 with the cylindrical electrodes 24 formed in is filled with the insulating film 26.

Figure 3E:
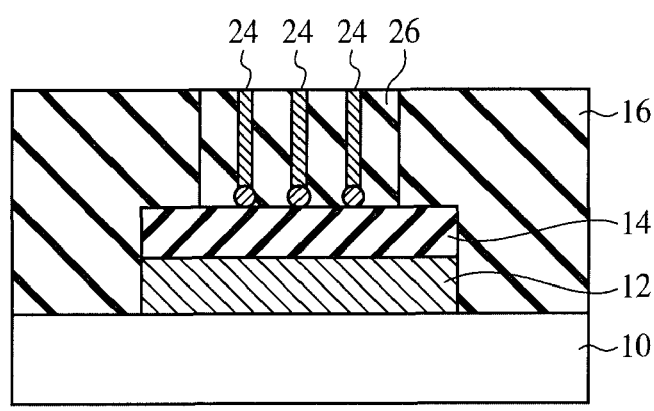

Next, the insulating films 26, 16 are polished by, e.g., chemical mechanical polishing (CMP) method until the upper ends of the cylindrical electrodes 24 are exposed (FIG. 3E).

Next, over the entire surface, a 10 nm-thickness titanium (Ti) film 28, for example, and a 100 nm-thickness Cu film 28, for example, are deposited by, e.g., sputtering method or evaporation method.

Figure 3F:
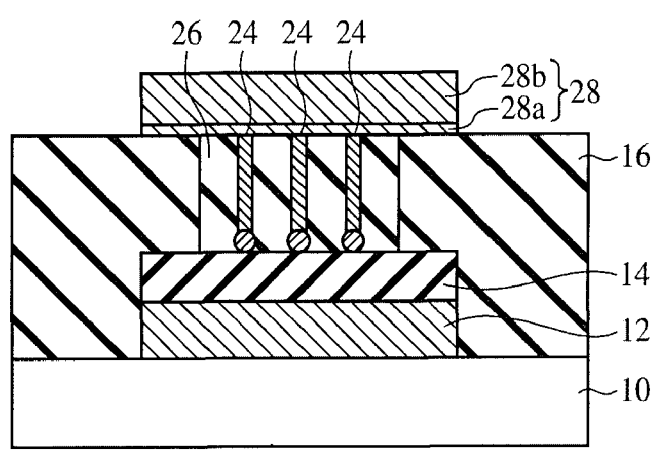

Then, the Cu film 28b and the Ti film 28a are patterned by photolithography and ion milling to form the upper electrodes 28 of the Ti film 28a and the Cu film 28b, electrically connected to the cylindrical electrodes 24 (FIG. 3F).

As described above, according to the present embodiment, in the resistance memory element including the resistance memory layer sandwiched between the lower electrode and the upper electrode, the cylindrical electrodes of the carbon nanotubes are provided in the region of the upper electrode, which is contact with the resistance memory layer, which permits the position and the density of the filament-shaped current path which contributes to the resistance states of the resistance memory element to be controlled by the positions and the density of the cylindrical electrodes.

A Second Embodiment

The resistance memory element and the method of manufacturing the same according to a second embodiment of the present invention will be explained with reference to FIGS. 4 to 5E. The same members as those of the resistance memory element according to the first embodiment shown in FIGS. 1 to 3F are represented by the same reference numbers not to repeat or to simplify their explanation.

Figure 4:
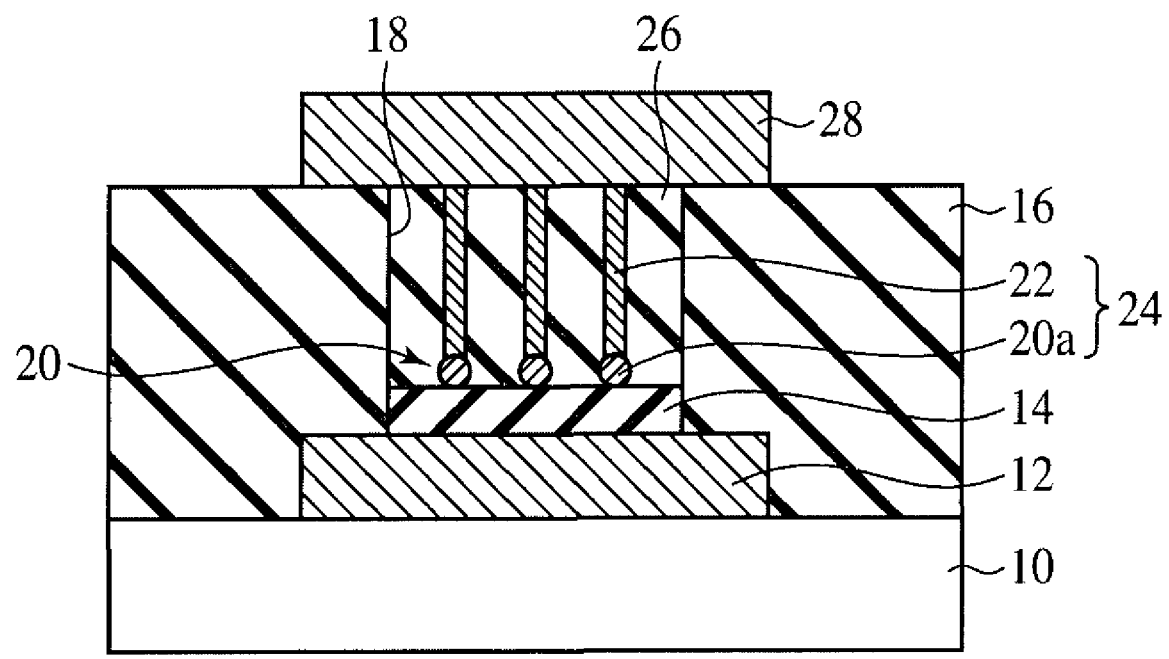
FIG. 4 is a diagrammatic sectional view showing the structure the resistance memory element according to a second embodiment of the present invention.

FIG. 4 is a diagrammatic sectional view showing the structure of the resistance memory element according to the present embodiment. FIGS. 5A-5E are sectional views showing the method of manufacturing the resistance memory element according to the present embodiment.

First, the structure of the resistance memory element according to the present embodiment will be explained with reference to FIG. 4.

Over a substrate 10, a lower electrode 12 is formed. Over the substrate 10 with the lower electrode 12 formed on, an insulating film 16 with an opening 18 down to the lower electrode 12 formed in is formed. On the lower electrode 12 in the opening 18, a resistance memory layer 14 is formed. On the resistance memory layer 14, a catalytic metal layer 20 containing a plurality of catalytic metal isles 20a is formed. On the catalytic metal isles 20a, carbon nanotubes 22 are formed. Thus, a plurality of cylindrical electrodes 24 of the catalytic metal isles 20a and a plurality of cylindrical electrodes 24 are formed. In the opening 18 with the cylindrical electrodes 24 formed in, an insulating film 26 is buried with the upper parts of the cylindrical electrodes 24 exposed. Over the insulating films 16, 26, an upper electrode 28 electrically connected to the cylindrical electrodes 24 is formed.

As described above, the resistance memory element according to the present embodiment is the same as the resistance memory element according to the first embodiment except that the resistance memory layer 14 is formed selectively on the lower electrode 12 in the opening 18. In the resistance memory element according to the present embodiment as well, the cylindrical electrodes 24 of the carbon nanotubes 22 are formed between the resistance memory layer 14 and the upper electrode 28, and the position and the density of the filament-shaped current path to be formed in the resistance memory layer 14 can be controlled by the positions and the density of the cylindrical electrodes 24.

Then, the method of manufacturing the resistance memory element according to the present embodiment will be explained with reference to FIGS. 5A to 5E.

Figure 5A:
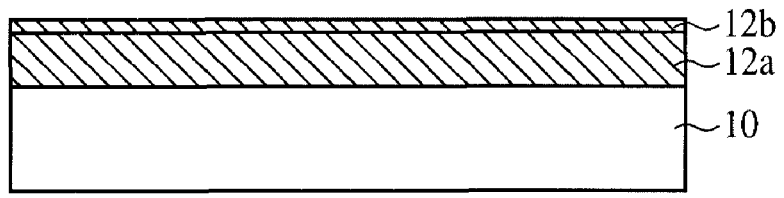
FIGS. 5A-5E are sectional views showing the method of manufacturing the resistance memory element according to the second embodiment of the present invention.

First, on the substrate 10, a 100 nm-thickness Cu film 12a, for example, and a 5 nm-thickness Ta film 12b, for example, are deposited by, e.g., sputtering method or evaporation method (FIG. 5A).

Next, by photolithography and ion milling, the Ta film 12b and the Cu film 12a are patterned to form the lower electrode 12 of the Cu film 12a and the Ta film 12b.

Figure 5B:
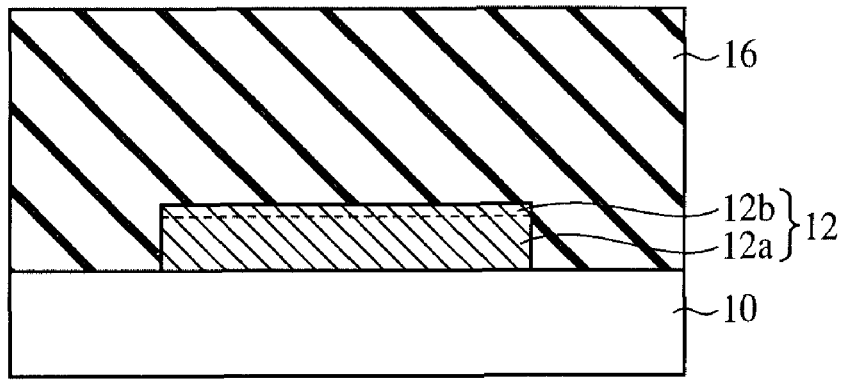

Next, over the substrate 10 with the lower electrode 12 formed on, a 350 nm-thickness $SiO_2$ film, for example, is deposited by, e.g., CVD method. Thus, the insulating film 16 of the $SiO_2$ film is formed (FIG. 5B).

Then, by photolithography and dry etching, the opening 18 down to the lower electrode 12 is formed in the insulating film 16.

Figure 5C:
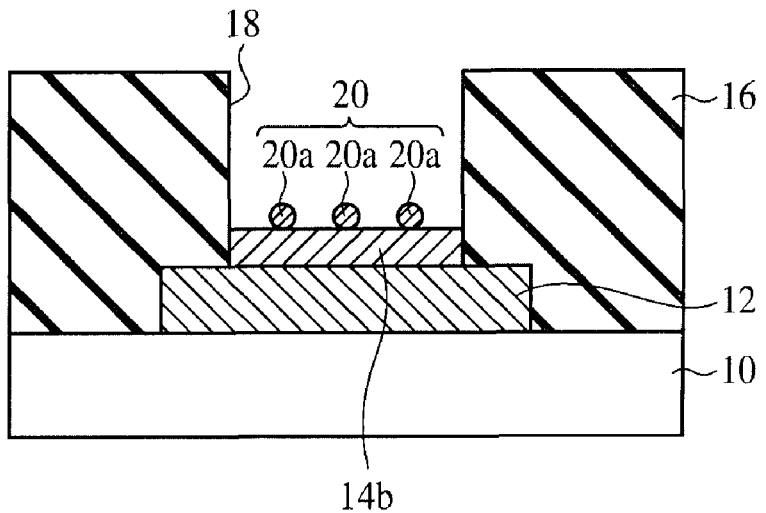

Next, on the lower electrode 12 in the opening 18, a Ti film 14b, and the catalytic metal layer 20 of a plurality of catalytic metal isles 20a formed isolated from each other is formed (FIG. 5C). The Ti film 14b may be formed by depositing Ti in, e.g., a 2 nm-thickness by, e.g., sputtering method or evaporation method. The catalytic metal layer 20 is formed by, as in the first embodiment, depositing Co in, e.g., a 1 nm-thickness by, e.g., sputtering method or evaporation method and annealing the same. The Ti film 14b and the catalytic metal layer 20 can be formed selectively in the opening 18 by lift-off using the photoresist film used in forming the opening 18 in the insulating film 16.

Here, the film formed on the lower electrode 12 (Ti film 14b) is formed of a metal material whose oxide is the resistance memory material, e.g., Ti, Ni or others.

Then, as in the first embodiment, on the catalytic metal layer 20, the carbon nanotubes 22 are grown. When the carbon nanotubes 22 are formed, the Ti film 14b is oxidized by oxygen, etc. residing in the film forming chamber to be $TiO_x$ ($0 \leq x \leq 2$) film. Thus, the resistance memory layer 14 of $TiO_x$ is formed.

When the carbon nanotubes 22 are formed, in place of using the oxygen residing in the film forming chamber, oxygen gas may be positively fed into the reaction chamber so as to oxidize the Ti film 14b. The step of oxidizing the Ti film 14b may be made separately from the step of forming the carbon nanotubes 22.

Figure 5D:
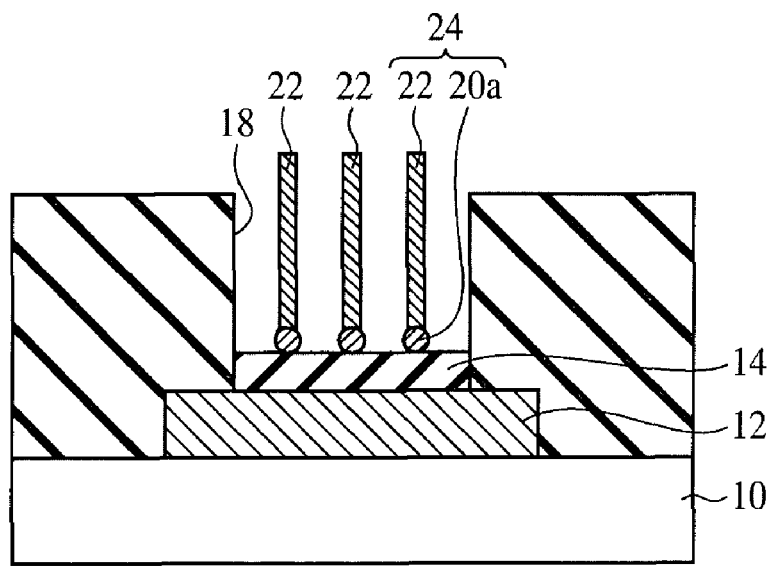

Thus, in the opening 18, a plurality of cylindrical electrodes 24 of the catalytic metal isles 20a and the carbon nanotubes 22 is formed (FIG. 5D).

Figure 5E:
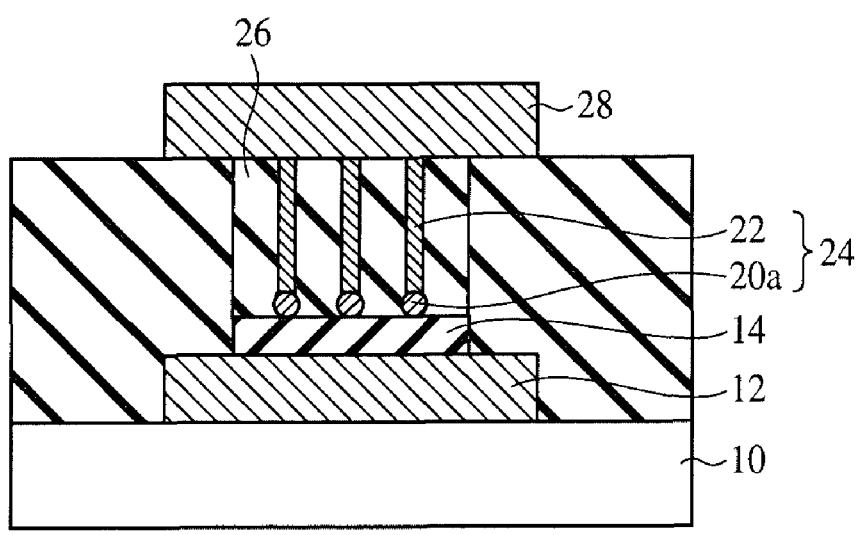

Then, in the same way as in the method of manufacturing the resistance memory element according to the first embodiment shown in, e.g., FIGS. 3D to 3F, the insulating film 26 and the upper electrode 28 are formed, and the resistance memory element according to the present embodiment is completed (FIG. 5E).

As described above, according to the present embodiment, the resistance memory element including the resistance memory layer sandwiched between the lower electrode and the upper electrode includes the cylindrical electrodes of the carbon nanotubes in the region of the upper electrode, which is in contact with the resistance memory layer, which permits the position and the density of the filament-shaped current path which contributes to the resistance states of the resistance memory element to be controlled by the positions and the density of the cylindrical electrodes.

A Third Embodiment

The resistance memory element and the method of manufacturing the same according to a third embodiment of the present invention will be explained with reference to FIGS. 6 to 7F. The same members of the present embodiment as those of the resistance memory element according to the first and the second embodiments shown in FIGS. 1 to 5E are represented by the same reference numbers not to repeat or to simplify their explanation.

Figure 6:
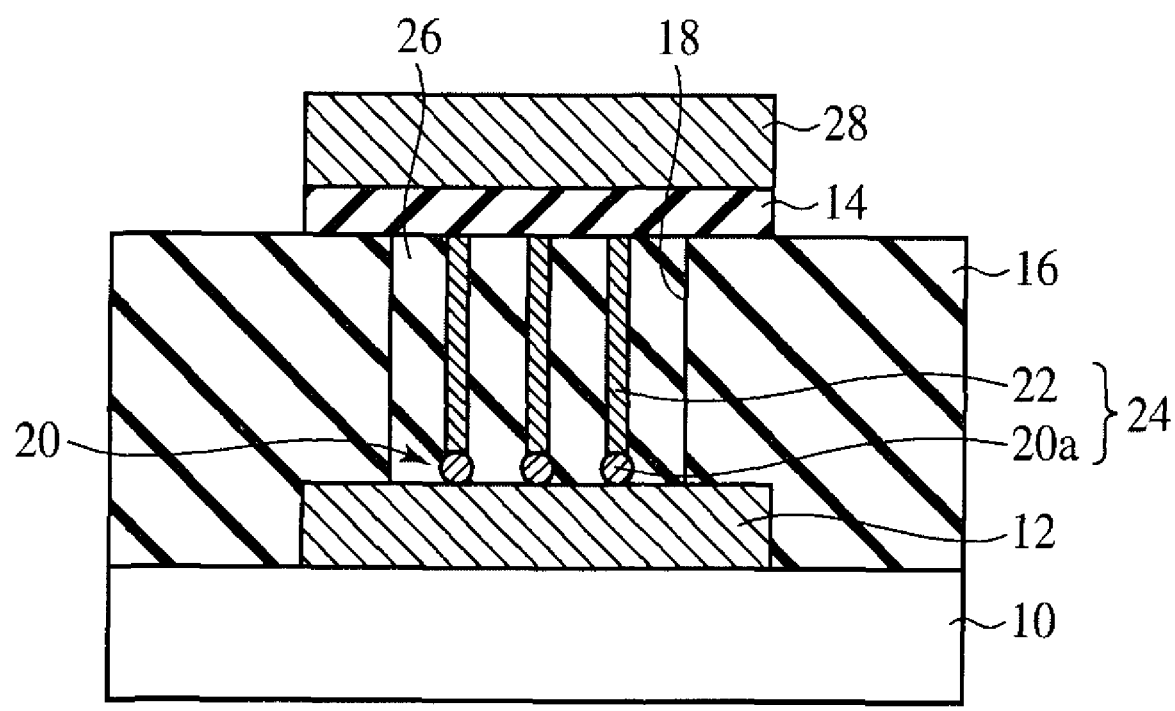
FIG. 6 is a diagrammatic sectional view showing the structure of the resistance memory element according to a third embodiment of the present invention.

FIG. 6 is a diagrammatic sectional view showing the structure of the resistance memory element according to the present embodiment. FIGS. 7A-7F are sectional views showing the method of manufacturing the resistance memory element according to the present embodiment.

First, the structure of the resistance memory element according to the present embodiment will be explained with reference to FIG. 6.

Over a substrate 10, a lower electrode 12 is formed. Over the substrate 10 with the lower electrode 12 formed on, an insulating film 16 with an opening 18 formed down to the lower electrode 12 is formed. On the lower electrode 12 in the opening 18, a catalytic metal layer 20 containing a plurality of catalytic metal isles 20a is formed. On the catalytic metal isles 20a, carbon nanotubes 22 are formed. Thus, a plurality of cylindrical electrodes 24 of the catalytic metal isles 20a and the carbon nanotubes 22 are formed. In the opening 18 with the cylindrical electrodes 24 formed in, an insulating film 26 is buried with the upper parts of the cylindrical electrodes 24 exposed. Over the insulating films 16, 26, a resistance memory layer 14 which is in contact with the cylindrical electrodes 24 is formed. On the resistance memory layer 14, an upper electrode 28 is formed.

As described above, in the resistance memory element according to the present embodiment, the cylindrical electrodes 24 of the catalytic metal isles 20a and the carbon nanotubes 22 are formed between the lower electrode 12 and the resistance memory layer 14. With the cylindrical electrodes 24 formed between the lower electrode 12 and the resistance memory layer 14 as well, the position and the density of the filament-shaped current path to be formed in the resistance memory layer 14 is defined by the positions and the density of the cylindrical electrode 24. Accordingly, the positions and the density of the cylindrical electrodes 24 are suitably controlled, whereby the position and the density of the filament-shaped current path can be controlled.

Then, the method of manufacturing the resistance memory element according to the present embodiment will be explained with reference to FIGS. 7A-7F.

Figure 7A:
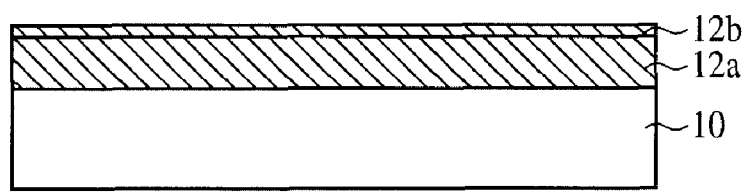
FIGS. 7A-7F are sectional views showing the method of manufacturing the resistance memory element according to the third embodiment of the present invention.

First, over the substrate 10, a 100 nm-thickness Cu film 12a, for example, and a 5 nm-thickness Ta film 12b, for example, are deposited by, e.g., sputtering method or evaporation method (FIG. 7A).

Next, the Ta film 12b and the Cu film 12a are patterned by photolithography and ion milling to form the lower electrode 12 of the Cu film 12a and the Ta film 12b.

Figure 7B:
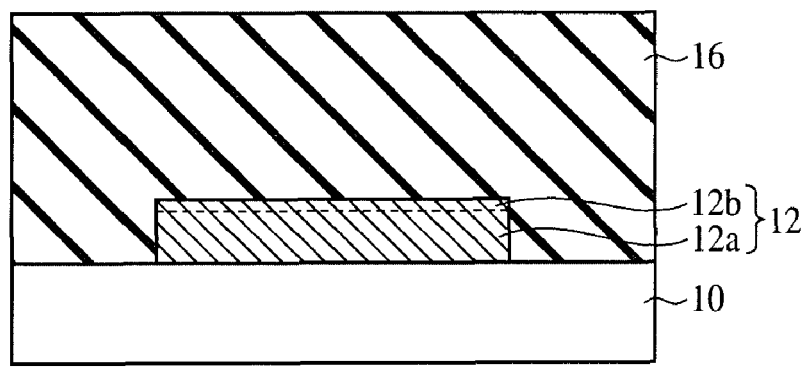

Next, over the substrate 10 with the lower electrode 12 formed on, a 350 nm-thickness $SiO_2$ film, for example, is deposited by, e.g., CVD method. Thus, the insulating film 16 of the $SiO_2$ film is formed (FIG. 7B).

Then, by photolithography and dry etching, the opening 18 down to the lower electrode 12 is formed in the insulating film 16.

Figure 7C:
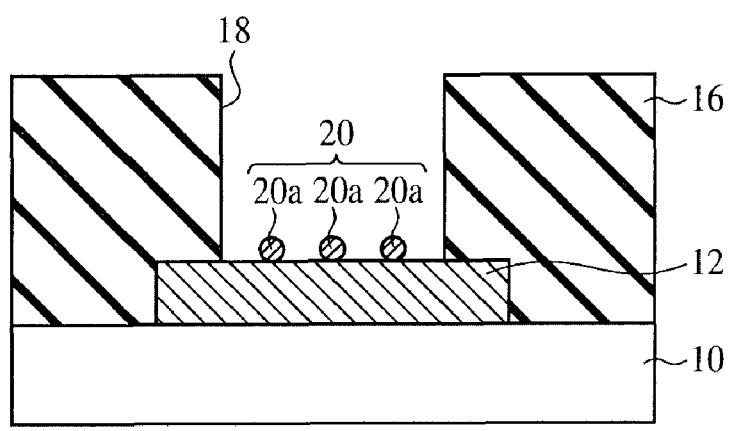

Next, on the lower electrode 12 in the opening 18, the catalytic metal layer 20 of a plurality of catalytic metal isles 20a formed isolated from each other is formed (FIG. 7C). The catalytic metal layer 20 is formed by, as in the first embodiment, depositing Co in, e.g., a 1 nm-thickness by, e.g., sputtering method or evaporation method and annealing the same. The catalytic metal layer 20 can be formed selectively in the opening 18 by lift-off using the photoresist film used in forming the opening 18 in the insulating film 16.

Then, as in the first embodiment, on the catalytic metal layer 20, the carbon nanotubes 22 are grown. Thus, a plurality of cylindrical electrodes 24 of the catalytic metal isles 20a and the carbon nanotubes 22 are formed in the opening 18.

Figure 7D:
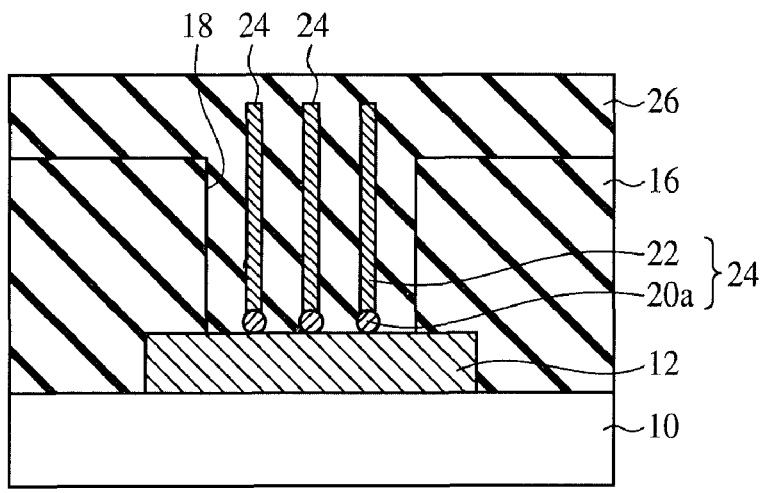

Next, a 500 nm-thickness $SiO_2$ film, for example, is deposited on the entire surface by, e.g., CVD method. Thus, the insulating film 26 of the $SiO_2$ film is formed (FIG. 7D). Thus, in the opening 18 with the cylindrical electrodes 24 formed in, the insulating film 26 is buried.

Figure 7E:
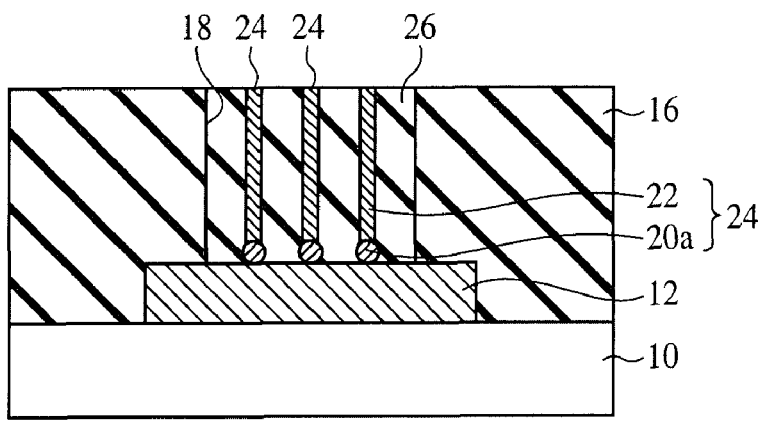

Then, the insulating films 26, 16 are polished by, e.g., CMP method until the upper ends of the cylindrical electrodes 24 are exposed (FIG. 7E).

Next, over the entire surface, a 30 nm-thickness $TiO_2$ film, for example, a 10 nm-thickness Ti film, for example, and a 100 nm-thickness Cu film, for example, are deposited by, e.g., sputtering method or evaporation method.

Figure 7F:
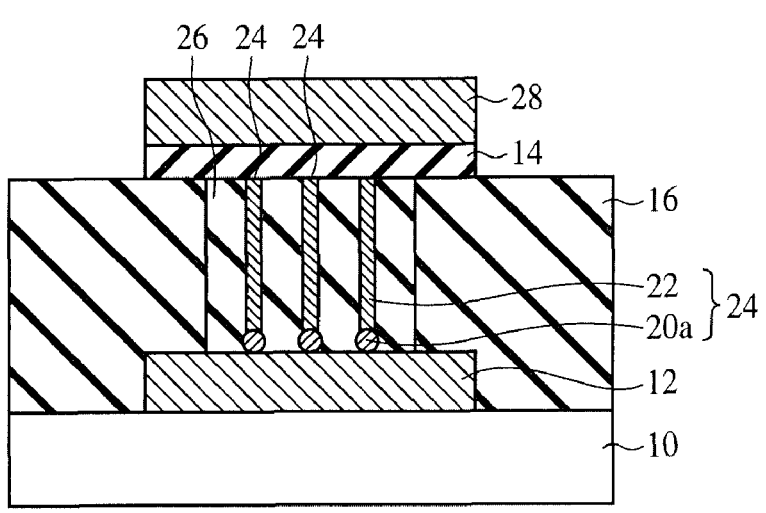

Then, the Cu film, the Ti film and the $TiO_2$ film are patterned by photolithography and ion milling to form the resistance memory layer 14 of the $TiO_2$ film and the upper electrode 28 of the Ti film and the Cu film, and the resistance memory element according to the present embodiment is completed (FIG. 7F).

As described above, according to the present embodiment, the resistance memory element including the resistance memory layer sandwiched between the lower electrode and the upper electrode includes the cylindrical electrodes of the carbon nanotubes in the region of the lower electrode, which is in contact with the resistance memory layer, whereby the position and the density of the filament-shaped current path which contributes to the resistance states of the resistance memory element can be controlled by the positions and the density of the cylindrical electrodes.

A Fourth Embodiment

The nonvolatile semiconductor memory device according to a fourth embodiment of the present invention will be explained with reference to FIG. 8.

Figure 8:
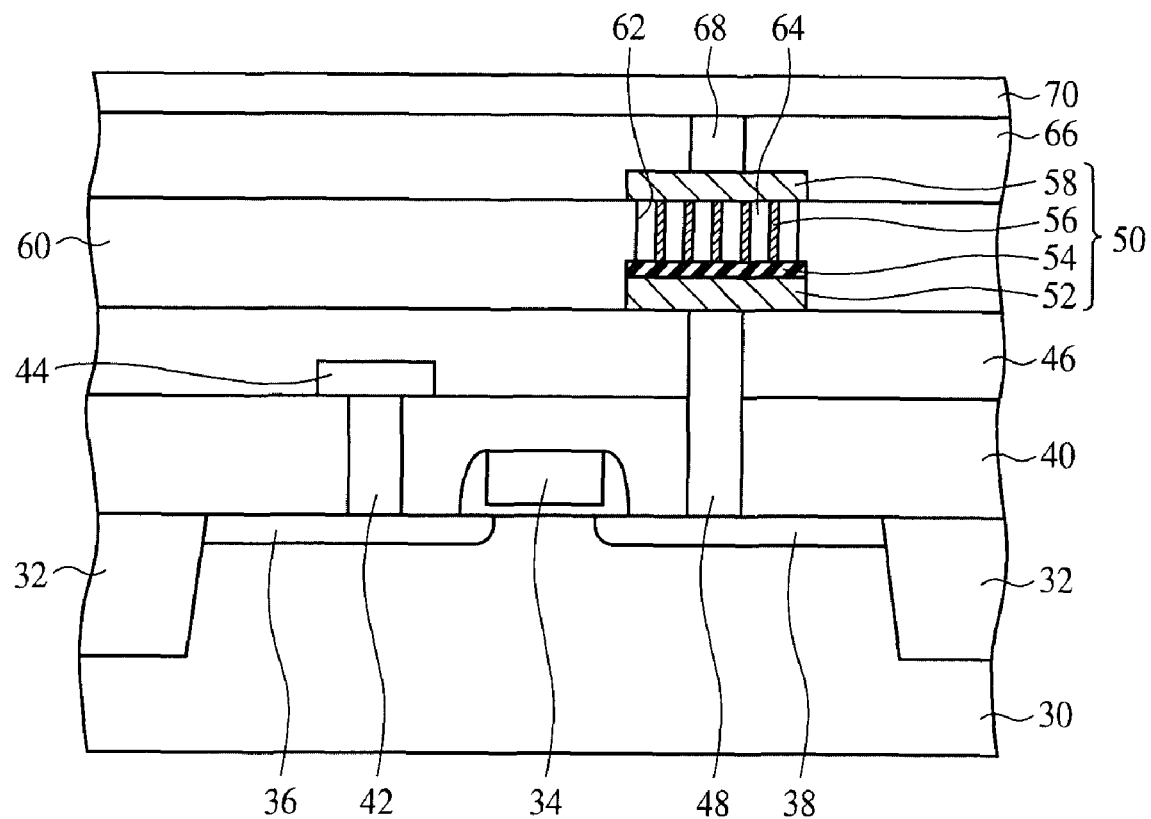
FIG. 8 is a diagrammatic sectional view showing the structure of the nonvolatile semiconductor memory according to a fourth embodiment of the present invention.

FIG. 8 is a diagrammatic sectional view showing the structure of the nonvolatile semiconductor memory device according to the present embodiment.

In a silicon substrate 30, a device isolation film 32 for defining an active region is formed. In the active region defined by the device isolation film 32, a memory cell transistor including a gate electrode 34 and source/drain regions 36, 38 are formed.

Over the silicon substrate 30 with the memory cell transistor formed on, an inter-layer insulating film 40 is formed. In the inter-layer insulating film 40, a contact plug 42 connected to the source/drain region is buried. On the inter-layer insulating film 40, a source line 44 electrically connected to the source/drain region 36 via the contact plugs 42 is formed.

Over the inter-layer insulating film 40 with the source line 44 formed on, an inter-layer insulating film 46 is formed. In the inter-layer insulating films 46, 40, a contact plug 48 connected to the source/drain region 38 is buried.

Over the inter-layer insulating film 46, a lower electrode 52 electrically connected to the source/drain region 38 via the contact plug 48 is formed. On the lower electrodes 52, a resistance memory layer 54 is formed. On the inter-layer insulating film 46 with the lower electrodes 52 and the resistance memory layer 54 formed on, an inter-layer insulating film 60 with an opening 62 formed down to the resistance memory layer 54 is formed. In the opening 62, a plurality of cylindrical electrodes 56 is formed. In the gaps among the cylindrical electrodes 56 in the openings 62, an insulating film 64 is buried.

Over the inter-layer insulating film 60 and the insulating film 64, an upper electrode 58 connected to the cylindrical electrodes 56 is formed. Thus, the resistance memory element according to the first embodiment including the lower electrode 52 connected to the contact plug 48, the resistance memory layer 54 formed on the lower electrode 52, the cylindrical electrodes 56 formed on the resistance memory layer 54, and the upper electrodes 58 connected to the cylindrical electrodes 56 are formed.

Over the inter-layer insulating film 60 with the upper electrode 58 formed on, an inter-layer insulating film 66 is formed. In the inter-layer insulating film 66, a contact plug 68 connected to the upper electrode 58 is buried. Over the inter-layer insulating film 66, a bit line 70 connected to the upper electrodes 68 of the resistance memory element 50 is formed.

Thus, the nonvolatile semiconductor memory device comprising memory cells each including the memory cell transistor and the resistance memory element 50 is constituted.

As the resistance memory element of the nonvolatile semiconductor memory using the resistance memory element, the resistance memory element according to the first embodiment is used, which facilitates the downsizing of the resistance memory element, and resultantly the nonvolatile semiconductor memory can be highly integrated.

As described above, according to the present embodiment, the nonvolatile semiconductor memory device using the resistance memory element which includes the resistance memory layer sandwiched between the lower electrode and the upper electrode and memorizes a plurality of resistance states includes the cylindrical electrodes of carbon nanotubes in the region of the upper electrode of the resistance memory element, which is in contact with the resistance memory layer, whereby the position and the density of the filament-shaped current path which contributes to the resistance states of the resistance memory element can be controlled by the positions and the density of the cylindrical electrode. Thus, the integration and high operation speed of the nonvolatile semiconductor memory can be improved.

Modified Embodiments

The present invention is not limited to the above-described embodiments and can cover other various modifications.

For example, in the above-described embodiments, the cylindrical electrode 24 is formed of carbon nanotubes 22, but in place of the carbon nanotubes 22, other cylindrical structures may be used. As the cylindrical structure of carbon atoms, for example, carbon nanofiber is known in addition to carbon nanotube, and in place of carbon nanotube, carbon nanofiber may be used. As the catalytic metal used in growing the cylindrical structure of carbon atoms, Fe, Ni, etc. other than Co can be used.

In the above-described embodiments, as the resistance memory material forming the resistance memory element, $TiO_2$ is used, but the resistance memory material is not limited to $TiO_2$. As the resistance memory materials applicable to the present invention are $TiO_x$, $NiO_x$, $YO_x$, $CeO_x$, $MgO_x$, $ZnO_x$, $ZrO_x$, $HfO_x$, $WO_x$, $NbO_x$, $TaO_x$, $CrO_x$, $MnO_x$, $AlO_x$, $VO_x$, $SiO_x$, etc. Oxide materials containing a plurality of metals or semiconductors, such as $Pr_{1-x}Ca_xMnO_3$, $La_{1-x}Ca_xMnO_3$, $SrTiO_3$, $YBa_2Cu_3O_y$, $LaNiO$, etc., can be also used. These resistance memory materials may be used singly or in layer structures.

In the above-described embodiments, the lower electrode is formed of the layer film of Cu film and Ta film, and the upper electrode is formed of the layer film of Ti film and Cu film. However, the constituent materials of the electrodes are not limited to them. As the electrode materials applicable to the present invention are, e.g., Ir, W, Ni, Au, Cu, Ag, Pd, Zn, Cr, Al, Mn, Ta, Ti, Si, TaN, TiN, Ru, ITO, NiO, IrO, SrRuO, $CoSi_2$, $WSi_2$, $NiSi$, $MoSi_2$, $TiSi_2$, Al—Si, Al—Cu, Al—Si—Cu, etc. Preferably, the electrode material is selected suitably for the compatibility with the resistance memory material, etc.

In the above-described fourth embodiment, as the resistance memory element of the nonvolatile semiconductor memory device, the resistance memory element according to the first embodiment is used, but the resistance memory element according to the second or the third embodiment may be used.

In the first, the second and the fourth embodiments, the cylindrical electrodes are provided between the resistance memory layer and the upper electrode, and in the third embodiment, the cylindrical electrodes are provided between the lower electrode and the resistance memory layer. However, the cylindrical electrodes may be provided between the resistance memory layer and the upper electrode and between the lower electrode and the resistance memory layer.

In the first to the fourth embodiments, the resistance memory element according to the present invention is applied to RRAM, but the resistance memory element according to the present invention is applicable to nonvolatile semiconductor memory device other than RRAM. For example, the resistance memory element according to the present invention is applicable to a read only memory (ROM). For ROM, the resistance memory element whose resistance state is unreversibly changed by once writing may be used. For example, a resistance memory element which initially has the high resistance state, has the insulating film broken by the application of a prescribed voltage and has the low resistance state, and hereafter retains the low resistance state is applicable. Such resistance memory element may not be formed of the special resistance memory materials as used in RRAM and can be formed of the general insulating materials and semiconductor materials, e.g., silicon oxide film, silicon nitride film, etc.

What is claimed is:

1. A method of manufacturing a resistance memory element comprising:
    forming a lower electrode over a substrate;
    forming a first insulating film on the lower electrode;
    forming a plurality of cylindrical electrodes of a cylindrical structure of carbon on the insulating film;
    forming a second insulating film buried in a space between the plurality of cylindrical electrodes; and
    forming an upper electrode electrically connected to the plurality of cylindrical electrodes on the plurality of cylindrical electrodes.

2. The method of manufacturing a resistance memory element according to claim 1, wherein
    in forming the first insulating film, a metal film of a metal material whose oxide becomes an insulator is formed, and the metal material is oxidized to change into the first insulating film.

3. The method of manufacturing a resistance memory element according to claim 2, wherein
    the metal film is changed into the first insulating film concurrently with forming the plurality of cylindrical electrodes.

4. The method of manufacturing a resistance memory element according to claim 2, wherein
    the cylindrical structure is a carbon nanotube.

5. The method of manufacturing a resistance memory element according to claim 2, wherein
    the first insulating film is formed of a resistance memory material whose high resistance state and low resistance state are switched by application of a voltage.

6. The method of manufacturing a resistance memory element according to claim 5, wherein
    the resistance memory material is titanium oxide, nickel oxide, $Pr_{1-x}Ca_xMnO_3$ or $La_{1-x}Ca_xMnO_3$.

7. A method of manufacturing a resistance memory element comprising:
    forming a lower electrode over a substrate;
    forming on the lower electrode a plurality of cylindrical electrodes of a cylindrical structure of carbon electrically connected to the lower electrode;
    forming a first insulating film buried in a space between the plurality of cylindrical electrodes;
    forming a second insulating film on the plurality of cylindrical electrodes; and
    forming an upper electrode on the second insulating film.

8. The method of manufacturing a resistance memory element according to claim 7, wherein
    the cylindrical structure is a carbon nanotube.

9. The method of manufacturing a resistance memory element according to claim 7, wherein
    the second insulating film is formed of a resistance memory material whose high resistance state and low resistance state are switched by application of a voltage.

10. The method of manufacturing a resistance memory element according to claim 9, wherein
    the resistance memory material is titanium oxide, nickel oxide, $Pr_{1-x}Ca_xMnO_3$ or $La_{1-x}Ca_xMnO_3$.

* * * * *